US010504565B2

(12) United States Patent
Rowley

(10) Patent No.: US 10,504,565 B2
(45) Date of Patent: *Dec. 10, 2019

(54) POWER MANAGEMENT INTEGRATED CIRCUIT WITH DUAL POWER FEED

(71) Applicant: Micron Technology, Inc., Boise, ID (US)

(72) Inventor: Matthew David Rowley, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/438,311

(22) Filed: Jun. 11, 2019

(65) Prior Publication Data

US 2019/0295608 A1    Sep. 26, 2019

Related U.S. Application Data

(63) Continuation of application No. 15/918,627, filed on Mar. 12, 2018, now Pat. No. 10,325,631.

(51) Int. Cl.
*G11C 5/14*   (2006.01)
*G06F 1/26*   (2006.01)
*G06F 1/28*   (2006.01)

(52) U.S. Cl.
CPC .............. *G11C 5/147* (2013.01); *G06F 1/263* (2013.01); *G06F 1/266* (2013.01); *G06F 1/28* (2013.01)

(58) Field of Classification Search
CPC ....... G11C 5/147; G06F 1/263; G06F 16/266; G06F 1/28
See application file for complete search history.

(56) References Cited

U.S. PATENT DOCUMENTS

| | | | |
|---|---|---|---|
| 9,098,281 B2 * | 8/2015 | Shaeffer | G11C 7/1072 |
| 10,205,388 B2 * | 2/2019 | Choi | H02M 3/158 |
| 10,325,631 B1 * | 6/2019 | Rowley | G11O 5/147 |
| 2014/0108835 A1 | 4/2014 | Park et al. | |
| 2014/0281594 A1 | 9/2014 | Yang et al. | |
| 2017/0371574 A1 | 12/2017 | Springberg et al. | |
| 2018/0225053 A1 | 8/2018 | Yim et al. | |

OTHER PUBLICATIONS

"General-purpose input/output", Wikipedia, printed on Mar. 2, 2018.

* cited by examiner

*Primary Examiner* — Pho M Luu
(74) *Attorney, Agent, or Firm* — Greenberg Traurig, LLP

(57) ABSTRACT

A power management integrated circuit (PMIC) receives power from a host and a backup power supply in parallel and uses power from at least one of the host and the backup power supply to operate voltage regulators for a memory system. An enable signal is generated based on whether or not the voltage regulators are powered. The enable signal can be used to keep the backup power supply on while the memory system is in operation. In response to absence of power from the host, the PMIC generates an interrupt signal causing the memory system to shut down safely without data loss.

20 Claims, 3 Drawing Sheets

POWER MANAGEMENT INTEGRATED CIRCUIT WITH DUAL POWER FEED

RELATED APPLICATION

The present application is a continuation application of U.S. patent application Ser. No. 15/918,627, filed Mar. 12, 2018, issued as U.S. Pat. No. 10,325,631 on Jun. 18, 2019, and entitled "Power Management Integrated Circuit with Dual Power Feed," the entire disclosure of which is hereby incorporated herein by reference.

FIELD OF THE TECHNOLOGY

At least some embodiments disclosed herein relate to power management integrated circuit (PMIC) in general and, more particularly but not limited to, a PMIC with dual power feed.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

A memory system may use a Power Management Integrated Circuit (PMIC) to manage the power requirements of the system or subsystem. The PMIC typically includes electronic power conversion circuitry and/or relevant power control functions.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
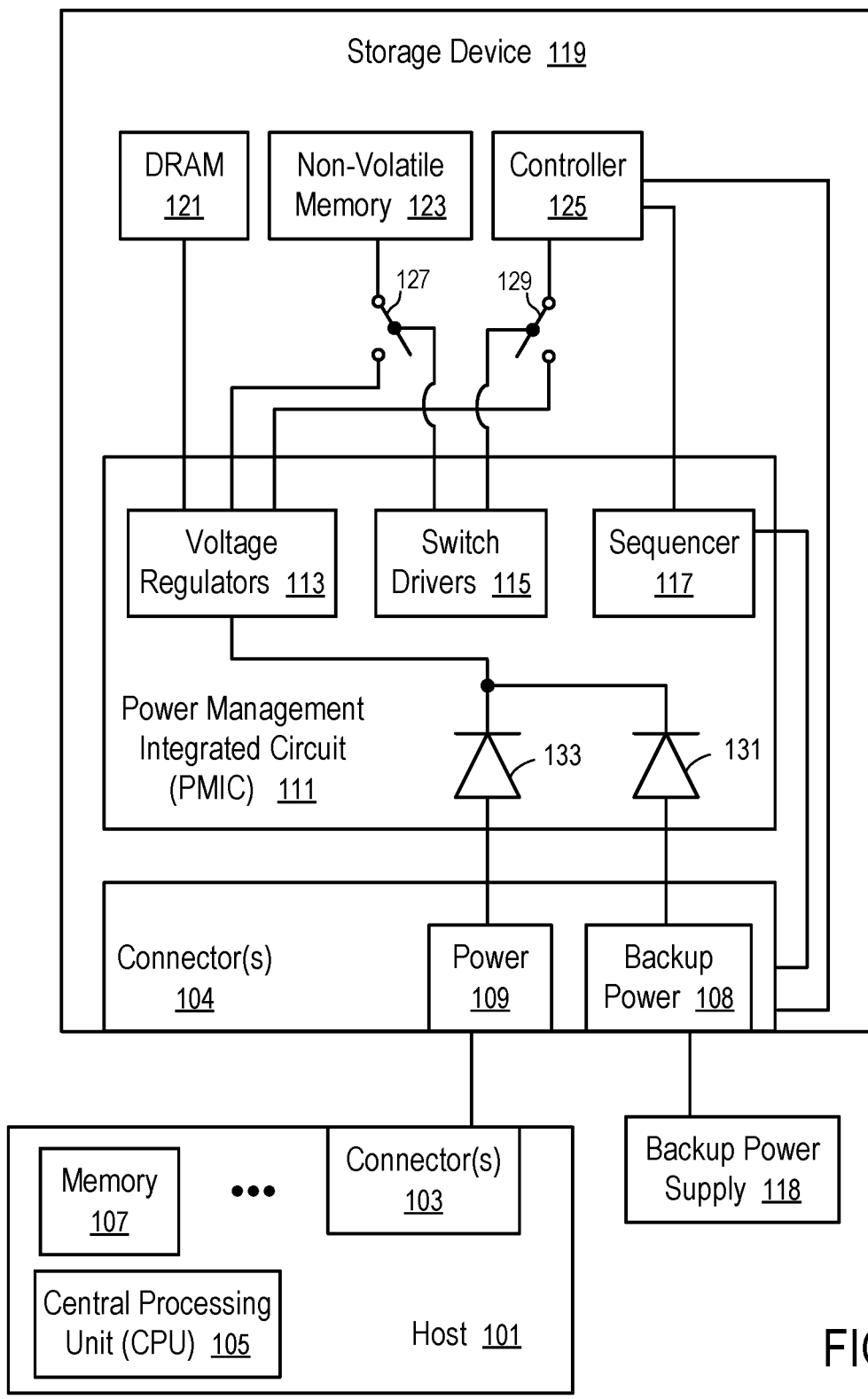
FIG. 1 shows a computer system having a power management integrated circuit (PMIC) that is capable of operating using power from a host and/or using power from a backup power supply.

Aspects of the present disclosure are directed to a power management integrated circuit (PMIC) in a memory system. An example of a memory system is a storage system, such as a solid-state drive (SSD). In some embodiments, the memory system is a hybrid memory/storage system. In general, a host system can utilize a memory system that includes one or more memory devices. The memory devices can include media. The media can be non-volatile memory devices, such as, for example, negative-and (NAND). The host system can provide write requests to store data at the memory devices of the memory system and can provide read requests to retrieve data stored at the memory system. A memory system can include a controller that manages the memory devices to perform operations such as reading data, writing data, or erasing data and other such operations. A storage system (also hereinafter referred to as storage device) is used as one example of the memory system hereinafter throughout this document.

A backup power supply can be used to prevent data loss during a power failure event. A PMIC according to at least some embodiments disclosed herein is configured with a dual power input capability to manage a backup power supply. Dual power inputs, such as one power input from a backup power supply and another power input from a host computer, are combined using diodes to power voltage regulators of the PMIC, such that power from either of the inputs can be used to support the normal operations of the PMIC in managing the power requirements of a computer storage device. Further, the PMIC can generate power management signals related to backup power, such as power enable signals for controlling the operation of the backup power supply and power failure interrupt signals to the controller of the computer storage device for proper shutdown, supported by the backup power supply, during a power failure in the host computer.

For example, the PMIC can be configured in a storage device to manage the power requirements of a storage device. The power from a host of the storage device and the power from a backup power supply are OR'ed using diodes of the PMIC to hold up internal power in the PMIC, allowing the PMIC to generate operating voltages for the storage device, during a sudden loss of power in the host, using the voltage regulators of the PMIC powered by the backup power supply.

In the case of a power failure event in the host, the power from the host may be insufficient or unavailable to support operations of the PMIC and the storage device. The power from the backup power supply goes through the OR'ed diodes to support the normal operations of the PMIC, allowing the PMIC to continue operating its voltage regulators and to continue supplying operating voltages to the components of the storage device, such as the storage media of the storage device and/or the controller of the storage device. The use of the backup power supply ensures that during such a power failure event, relevant state conditions of the components of the storage device can be held without glitches using the power from the backup power supply, while the storage device is provided with an opportunity to perform data backup/retention functions and to shut down properly.

Configuring the PMIC to have the dual power input capability allows the elimination of additional board level circuitry (comparators, diodes and filters) to implementing supports for the use of a backup power supply for the storage device. The use of such a PMIC reduces cost by fully integrating the control functionality within the PMIC, reduces the complexity of constructing a storage device that uses a backup power supply to prevent data loss, and reduces the area usage on the printed circuit board of the storage device.

FIG. 1 shows a computer system having a power management integrated circuit (PMIC) (111) that is capable of operating using power (109) from a host (101) and/or using power (108) from a backup power supply (118).

The computer system of FIG. 1 includes a host (101), a backup power supply (118), and a storage device (119) which has a power management integrated circuit (PMIC) (111), a controller (125), a non-volatile memory (123), and an optional Dynamic Random-Access Memory (DRAM) (121).

The PMIC (111) is configured to receive power from two separate sources, such as the host (101) and the backup power supply (118). The PMIC (111) has diodes (133 and 131) that combine the power from the two separate sources for voltage regulators (113) of the PMIC (111) such that the voltage regulators (113) can be operational using either the power (109) from the host (101) or the backup power (108) from the backup power supply (118). The diodes (133 and 131) provide a wired OR functionality to accept dual power inputs (109 and 108). During a time period in which the host (101) cannot supply sufficient power for the operations of the storage device (119), the power from the backup power supply (118) can be used to hold up relevant functions of the PMIC (111) and the storage device (119) appropriately while allowing the storage device (119) to shut down properly.

Incorporating in the PMIC (111) the wired OR functionality to accept dual power inputs (109 and 108), allows the elimination of additional circuit board level components for the utilization of a backup power supply (118) for a storage device (119), such as comparators, diodes, and filters. The cost of the storage device (119) can be reduced by fully integrating the control functionality related to the backup power supply (118) within the PMIC (111).

For example, based on the status of the power inputs (109 and 108) the PMIC (111) can generate relevant enable signal(s) and provide, e.g., using one or more general-purpose input/output pins, the enable signal(s) to one or more power supplies (e.g., 118) throughout the computer system to ensure glitch-less operations.

For example, based on the status of the main power input (109), the PMIC (111) can generate a priority power failure interrupt signal to the controller (125), which allows the storage device (119) to shut down elegantly when the main power input (109) is insufficient. For example, the storage device (119) may shut down using the power from the backup power supply (118) while the host (101) is not responsive in some situations when the power from the host (101) is not available to the storage device (119).

In some implementations, when the power (109) from the host (101) is available, the power from the host (101) may cause the reverse bias of the diode (131) even when the backup power (108) is available and thus prevent the use of the backup power supply (118) in the storage device (119) when the host (101) can provide sufficient power (109).

In other implementations, when the power (109) from the host (101) and the power (108) from the backup power (108) are both available, the voltage regulators (113) may draw power from both sources (109 and 108) simultaneously.

In general, the host (101) can be a computer having one or more Central Processing Units (CPUs) (105) and a memory (107). Computer peripheral devices, such as the storage device (119), may be attached to the host (101) via an interconnect, such as a computer bus (e.g., Peripheral Component Interconnect (PCI), PCI eXtended (PCI-X), PCI Express (PCIe), Serial Advanced Technology Attachment (SATA)), a communication port, and/or a computer network.

The host (101) has one or more connectors (e.g., 103) to provide the storage device (119) with power (109) and/or to communicate with the storage device (119) via a communication channel in accordance with a predetermined protocol; and the storage device (119) has one or more connectors (e.g., 104) to receive the power (109), data and commands from the host (101).

The PMIC (111) has one or more voltage regulators (113 and 133) that convert the power (109 and/or 108) to operating voltages used by various components of the storage device (119), such as the controller (125), the non-volatile memory (123), and the DRAM (121).

The storage device (119) may include a plurality of load switches (e.g., 127 and 129) for the isolation of power domains. During certain operational modes the load switches (127 and 129) are turned on to provide power (109) via the voltage regulators (113) to these corresponding components. During certain non-operational modes the load switches (127 and 129) can be turned off to isolate the power (109) from some of the components of the storage device (119), such as the controller (125), the non-volatile memory (123). To reduce the cost of the PMIC (111), the load switches (127 and 129) are implemented outside of the PMIC (111). The PMIC (115) includes a plurality of switch drivers (115) that provide the control signals for the load switches (127 and 129).

The PMIC (111) includes a sequencer (117 or 137) that schedules the power related events according to desirable sequences for the operations of the storage device (119), including the sequences of the operations of the voltage regulators (113) and the switch drivers (115). In some situations the sequencer (117 or 137) may communicate with the controller (125) to request the controller (125) to enter a sleep mode or a power off mode and then turn off certain voltages or power domains; and in other situations, the controller (125) may request the sequencer (117) to place the PMIC (111) in a sleep mode.

In general, some control signals, data and/or commands received from the host (101) are connected to the PMIC (111) for power managements. Other control signals, data and commands from the host (101) are routed to the controller (125) for processing.

The computer storage device (119) can be used to store data for the host (101). Examples of computer storage devices in general include hard disk drives (HDDs), solid state drives (SSDs), flash memory, dynamic random-access memory, magnetic tapes, network attached storage device, etc. The storage device (119) communications with the host (101) using the communication channel. For example, the communication channel between the host (101) and the storage device (119) is a PCIe bus in one embodiment; and the host (101) and the storage device (119) communicate with each other using NVMe protocol.

In some implementations, the communication channel between the host (101) and the storage device (119) includes a computer network, such as a local area network, a wireless local area network, a wireless personal area network, a cellular communications network, a broadband high-speed always-connected wireless communication connection (e.g., a current or future generation of mobile network link); and the host (101) and the storage device (119) can be configured to communicate with each other using data storage management and usage commands similar to those in NVMe protocol.

The controller (125) of the storage device (119) runs firmware to perform operations responsive to the communications from the host (101) and/or the PMIC (111). Firmware in general is a type of computer program that provides control, monitoring and data manipulation of engineered computing devices. The firmware of the storage device (119) controls the operations of the controller (125) in operating the storage device (119), such as storing and accessing data in non-volatile memory (123) of the storage device (119), performing power management tasks, etc.

Non-volatile storage media (123) in general may be implemented via various techniques, such as memory cells in an integrated circuit, magnetic material coated on rigid disks, etc. The storage media (123) is non-volatile in that no power is required to maintain the data/information stored in the non-volatile storage media (123), which data/information can be retrieved after the non-volatile storage media (123) is powered off and then powered on again. The memory cells may be implemented using various memory/storage technologies, such as NAND gate based flash memory, phase-change memory (PCM), magnetic memory (MRAM), resistive random-access memory, and 3D XPoint, such that the storage media (123) is non-volatile and can retain data stored therein without power for days, months, and/or years.

The storage device (119) may use volatile Dynamic Random-Access Memory (DRAM) (121) for the storage of run-time data and instructions used by the controller (125) to improve the computation performance of the controller (125) and/or provide buffers for data transferred between the host (101) and the non-volatile storage media (123). DRAM (121) is volatile in that it requires power to maintain the data/information stored therein, which data/information is lost immediately or rapidly when the power is interrupted.

Volatile DRAM (121) typically has less latency than non-volatile storage media (123), but loses its data quickly when power is removed. Thus, it is advantageous to use the volatile DRAM (121) to temporarily store instructions and data used for the controller (125) in its current computing task to improve performance. In some instances, the volatile DRAM (121) is replaced with volatile Static Random-Access Memory (SRAM) that uses less power than DRAM in some applications. When the non-volatile storage media (123) has data access performance (e.g., in latency, read/write speed) comparable to volatile DRAM (121), the volatile DRAM (121) can be eliminated; and the controller (125) can perform computing by operating on the non-volatile storage media (123) for instructions and data instead of operating on the volatile DRAM (121).

For example, cross point storage and memory devices (e.g., 3D XPoint memory) have data access performance comparable to volatile DRAM (121). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In some instances, the controller (125) has in-processor cache memory with data access performance that is better than the volatile DRAM (121) and/or the non-volatile storage media (123). Thus, it is preferred to cache parts of instructions and data used in the current computing task in the in-processor cache memory of the controller (125) during the computing operations of the controller (125). In some instances, the controller (125) has multiple processors, each having its own in-processor cache memory.

Optionally, the controller (125) performs data intensive, in-memory processing using data and/or instructions organized in the storage device (119). For example, in response to a request from the host (101), the controller (125) performs a real time analysis of a set of data stored in the storage device (119) and communicates a reduced data set to the host (101) as a response. For example, in some applications, the storage device (119) is connected to real time sensors to store sensor inputs; and the processors of the controller (125) are configured to perform machine learning and/or pattern recognition based on the sensor inputs to support an artificial intelligence (AI) system that is implemented at least in part via the storage device (119) and/or the host (101).

In some implementations, the processors of the controller (125) are integrated with memory (e.g., 121 or 123) in computer chip fabrication to enable processing in memory and thus overcome the von Neumann bottleneck that limits computing performance as a result of a limit in throughput caused by latency in data moves between a processor and memory configured separately according to the von Neumann architecture. The integration of processing and memory increases processing speed and memory transfer rate, and decreases latency and power usage.

The storage device (119) can be used in various computing systems, such as a cloud computing system, an edge computing system, a fog computing system, and/or a stand-alone computer. In a cloud computing system, remote computer servers are connected in a network to store, manage, and process data. An edge computing system optimizes cloud computing by performing data processing at the edge of the computer network that is close to the data source and thus reduces data communications with a centralize server and/or data storage. A fog computing system uses one or more end-user devices or near-user edge devices to store data and thus reduces or eliminates the need to store the data in a centralized data warehouse.

Some embodiments involving the operation of the controller (125) can be implemented using computer instructions executed by the controller (125), such as the firmware of the controller (125). In some instances, hardware circuits can be used to implement at least some of the functions of the firmware. The firmware can be initially stored in the non-volatile storage media (123), or another non-volatile device, and loaded into the volatile DRAM (121) and/or the in-processor cache memory for execution by the controller (125).

Figure 2:
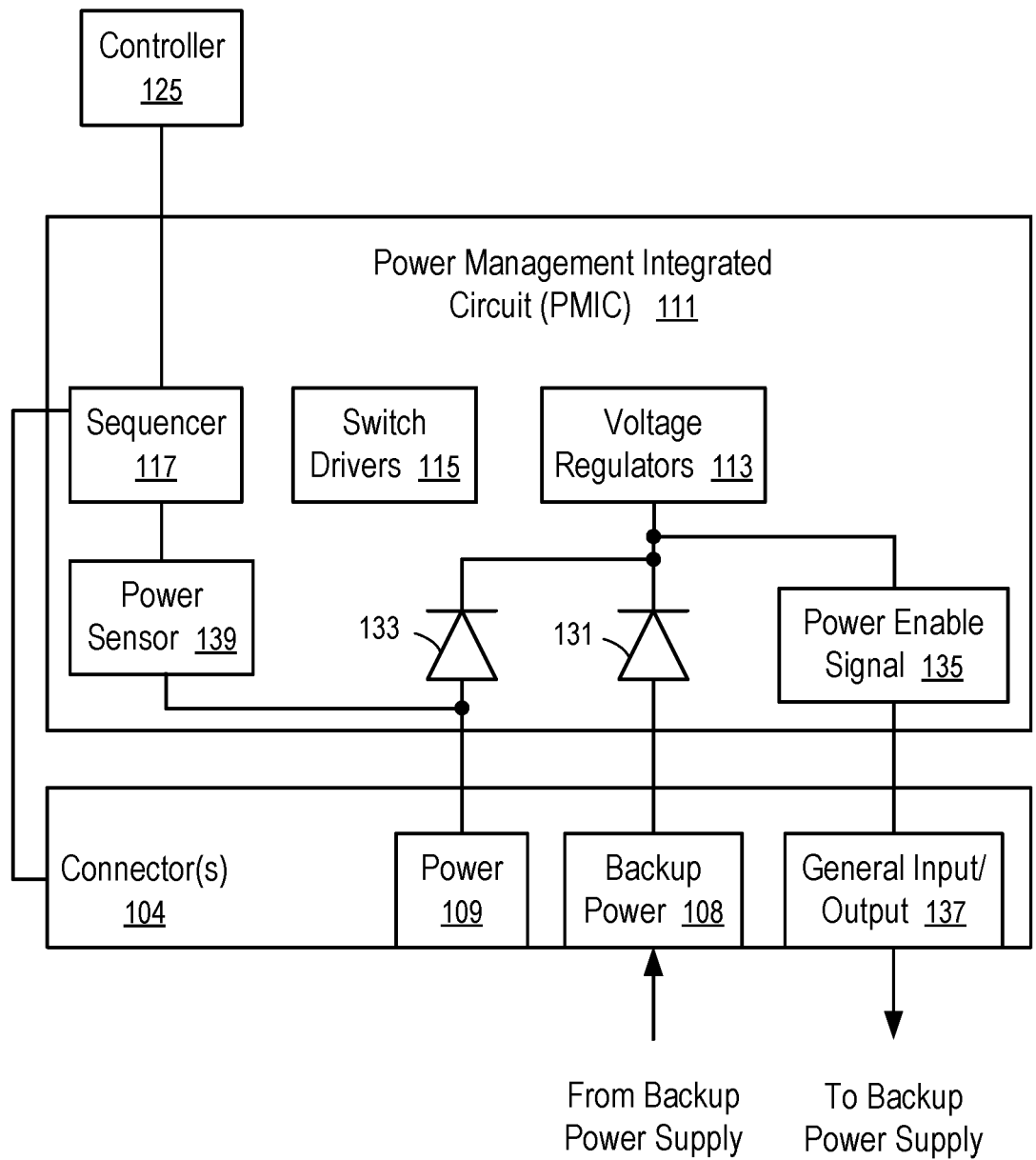
FIG. 2 shows a power management integrated circuit (PMIC) having dual power feed.

FIG. 2 shows a power management integrated circuit (PMIC) (111) having dual power feed. For example, the PMIC (111) of FIG. 2 can be used in the storage device (119) in the computer system of FIG. 1.

The PMIC (111) of FIG. 2 has multiple pins to receive power inputs from multiple sources, such as power (109) from the host (101) and backup power (108) from the backup power supply (118). The diodes (131 and 133) combine the power inputs (108 and 109) such that the voltage regulators (113) are operational when at least one of the power inputs (108 and 109) can provide sufficient power.

The PMIC (111) of FIG. 2 generates a power enable signal (135) from the power input to the voltage regulators (113). When at least one of the power inputs (108 and 109) is available, the power enable signal (135) is asserted; and when both of the power inputs (108 and 109) are not available, the power enable signal (135) is de-asserted.

The power enable signal (135) can be provided to a backup power supply (e.g., 118) via a general-purpose input/output (GPIO) pin or another pin. The power enable signal (135) can be used to inform the backup power supply (118) the need for power from the backup power supply (118), which keeps the backup power (108) providing power while the power enable signal (135) is asserted and the PMIC (111) is in operation. When the PMIC (111) is ready to shut down, the sequencer (117) may de-assert the power enable signal (135).

The PMIC (111) of FIG. 2 includes a power sensor (139) to detect the availability of the main power (109). When the voltage of the main power (109) is below a threshold (or when the diode (133) is reversely biased), the power sensor (139) causes the sequencer (117) to generate a priority power failure interrupt signal to the controller (125). The interrupt signal allows the controller (125) to prepare the storage device (119) for shutdown.

For example, in response to the priority power failure interrupt signal, the controller (125) may prioritize the completion of certain operations that are currently in progress, stop certain operations, and/or copy the content of the DRAM (121) and/or the cache memory of processors of the controller (125) to the non-volatile memory (123), etc.

In some instances, in response to the priority power failure interrupt signal, the PMIC (111) and/or the controller (125) may attempt to coordinate with the host (101) for a safe shutdown. For example, in response to the priority power failure interrupt signal, a request to shut down the storage device (119) is transmitted from the storage device (119) to the host (101); and if no response is received from the host (101) within a threshold period of time, the storage device (119) may shut down autonomously to avoid data loss and/or damage.

Figure 3:
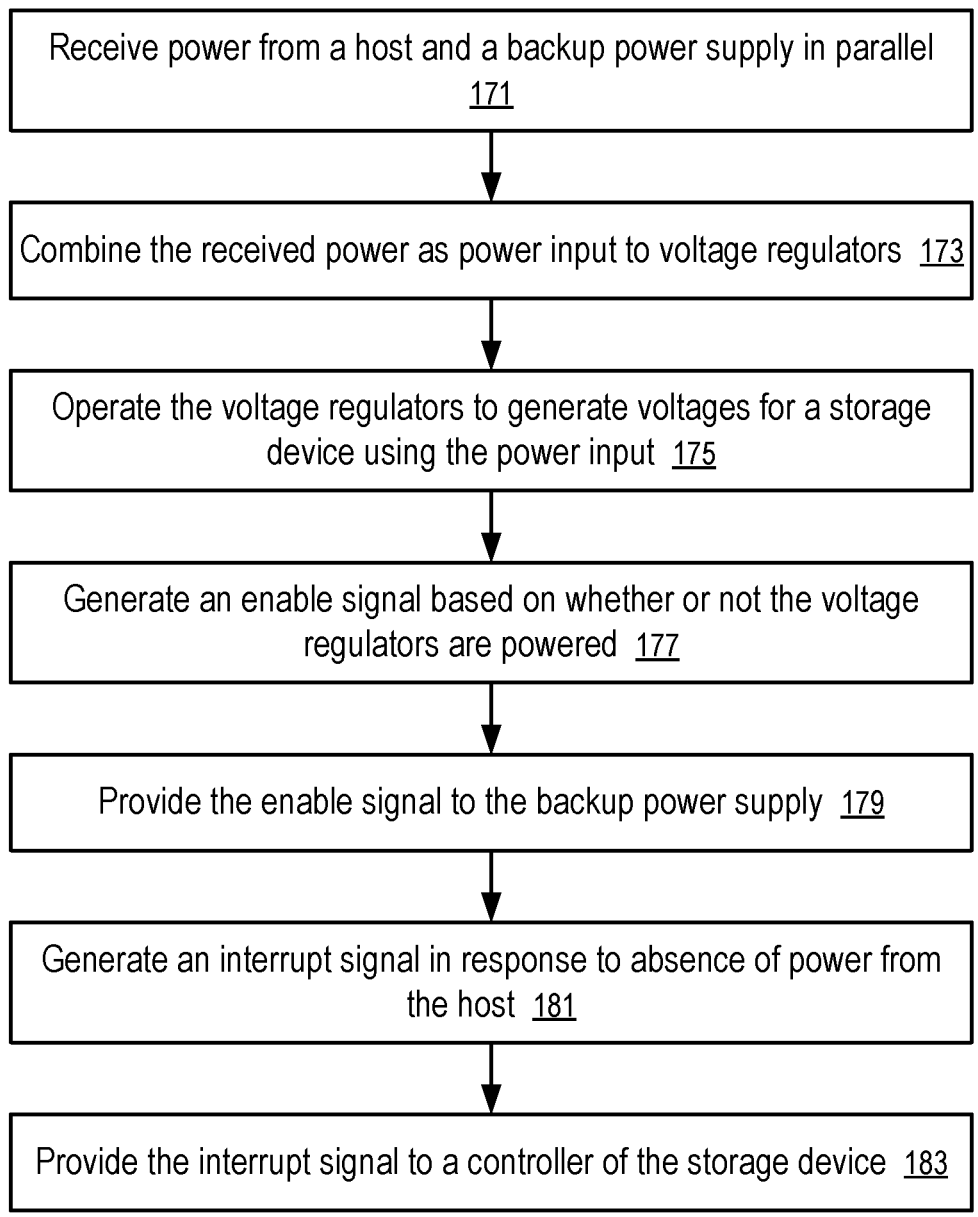
FIG. 3 shows a method to implement dual power feed in a power management integrated circuit (PMIC).

FIG. 3 shows a method to implement dual power feed in a power management integrated circuit (PMIC). For example, the method of FIG. 3 can be implemented in the PMIC (111) of FIG. 2 or the PMIC (111) in FIG. 1.

The method of FIG. 3 includes: receiving (171) power (108 and/or 109) from a host (101) and a backup power supply (118) in parallel; combining (173) the received power (108 and/or 109) as power input to voltage regulators (113); operating (175) the voltage regulators (113) to generate voltages for a storage device (119) using the power input; generating (177) an enable signal (135) based on whether or not the voltage regulators (113) are powered; providing (179) the enable signal (135) to the backup power supply (118) to control operation of the backup power supply (118); generating (181) an interrupt signal (139) in response to absence of power from the host (101); and providing (183) the interrupt signal (139) to a controller (125) of the storage device (119) that operates using the voltages generated by the voltage regulators (113).

For example, a power management integrated circuit (111) of one embodiment generally has: a first power input pin; a second power input pin; a plurality of voltage regulators (123) operable to generate a plurality of voltages for a data storage device (119); a sequencer to control one or more sequences of power events in the power management integrated circuit (111); and a dual feed circuit that powers the voltage regulators (113) using power from the first power input pin and/or the second power input pin.

The dual feed circuit may include a first diode (133) coupled to the first power input pin and a second diode (131) coupled to the second power input pin. The outputs of the first diode (133) and the second diode (131) are tied together to provide a combined power input to the voltage regulators (113).

When power is available from the first power input pin, the dual feed circuit powers the voltage regulators (113) using at least the power from the first power input pin. For example, the first power input pin may be connected to a host (101) of the storage device (119); and the second power input pin may be connected to a separate backup power supply (118).

Optionally, when power is available from the first power input pin, the second diode (131) is configured to be reversely biased to prevent drawing power from the second power input pin (e.g., to preserve available power in the backup power supply (118)). When power is available from the first power input pin but not available from the second power input pin, the second diode (131) is reversely biased to isolate the second power input pin from the power input of the voltage regulators (113).

When power is not available from the first power input pin, the dual feed circuit powers the voltage regulators (113) using power from the second power input pin (e.g., using power provided by a backup supply (118)). When power is available from the second power input pin but not available from the first power input pin, the first diode (133) reversely biased to isolate the first power input pin from the power input of the voltage regulators (113).

Optionally, when power is not available from the first power input pin, the dual feed circuit generates an interrupt signal to the controller (125) of the storage device (119). The interrupt signal informs the controller (125) of the power failure in the first power input pin. For example, the interrupt signal may be the inverse of the voltage status of the first power input pin, or a change of the voltage status of the first power input pin.

Preferably, the dual feed circuit also generates an enable signal (135). For example, the enable signal (135) may be the voltage at the input to the voltage regulators (113), a voltage status at the input to the voltage regulators (113), or the output voltage of one of the voltage regulators (113). When the voltage regulators (113) are powered by at least one of the first power input pin and the second power input pin, the enable signal (135) is asserted. When the voltage regulators (113) are not sufficiently powered by the first power input pin and the second power input pin (e.g., having a voltage below a threshold), the enable signal (135) is de-asserted.

The power management integrated circuit (111) may output the enable signal (135) using a general-purpose input/output pin to control, at least in part, the operation of a power supply (e.g., 118) that is connected to the second power input pin.

The power management integrated circuit (111) can be used in a storage device (119) has a non-volatile memory (123) and a controller (125).

A non-transitory computer storage medium can be used to store instructions of the firmware of the storage device (119). When the instructions are executed by the controller (125) of the computer storage device (119), the instructions cause the controller (125) to perform a method discussed above.

In this description, various functions and operations may be described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A power management integrated circuit, comprising:
    a first power input;
    a second power input; and
    at least one voltage regulator operable to generate voltages for a memory system;
    a sequencer configured to control one or more sequences of power events in the power management integrated circuit; and
    a circuit configured to combine the first power input and the second power input to power the at least one voltage regulator.

2. The power management integrated circuit of claim 1, wherein the circuit comprises a first diode coupled to the first power input and a second diode coupled to the second power input.

3. The power management integrated circuit of claim 1, wherein when power is available from the first power input, the circuit powers the at least one voltage regulator using at least the power from the first power input.

4. The power management integrated circuit of claim 1, wherein when power is available from the first power input, the circuit is configured to prevent drawing power from the second power input.

5. The power management integrated circuit of claim 4, wherein when power is not available from the first power input, the circuit powers the at least one voltage regulator using power from the second power input.

6. The power management integrated circuit of claim 5, wherein when power is not available from the first power input, the sequencer communicates an interrupt signal to a controller of the memory system.

7. The power management integrated circuit of claim 6, further comprising:
    an enable signal generator coupled to an output of the circuit configured to combine the first power input and the second power input.

8. The power management integrated circuit of claim 7, wherein:
    when the at least one voltage regulator is powered by at least one of the first power input and the second power input, the enable signal generator asserts an enable signal; and
    when the at least one voltage regulator is insufficiently powered by the first power input and the second power input, the enable signal generator de-asserts the enable signal.

9. The power management integrated circuit of claim 7, further comprising:

a general-purpose input/output pin connected to provide the enable signal.

10. The power management integrated circuit of claim 8, wherein the enable signal controls operation enabling of a power supply connected to the second power input.

11. A system, comprising:
a non-volatile memory device; and
a power management integrated circuit comprising:
at least one voltage regulator configured to generate operating voltages for the non-volatile memory device;
a first pin to receive power from a first power source;
a second pin to receive power from a second power source; and
a circuit configured to combine the first pin and the second pin to power the at least one voltage regulator.

12. The system of claim 11, wherein the circuit comprises:
a first diode connected to receive power from the first pin; and
a second diode connected to receive power from the second pin;
wherein power outputs from the first diode and the second diode are combined and connected as power input to the at least one voltage regulator.

13. The system of claim 11, wherein the circuit is further configured to generate an enable signal based on a status of the power input to the at least one voltage regulator.

14. The system of claim 13, wherein the enable signal controls at least in part operation of the second power source.

15. The system of claim 13, wherein the circuit is further configured to generate an interrupt signal to a controller coupled to the power management integrated circuit in response to absence of power from the first pin.

16. A method, comprising:
receiving power, from a first power source, in a first pin of a power management integrated circuit;
receiving power, from a second power source, in a second pin of the power management integrated circuit;
combining, in the power management integrated circuit, power from the first pin and power from the second pin to generate a combined power input; and
powering at least one voltage regulator of the power management integrated circuit using the combined power input to generate voltages for a memory device.

17. The method of claim 16, wherein the combining includes combining power from the first pin and power from the second pin using a first diode and a second diode respectively to generate the combined power input to the at least one voltage regulator.

18. The method of claim 16, further comprising:
generating an enable signal based on a status of the combined power input to the at least one voltage regulator.

19. The method of claim 18, further comprising:
providing the enable signal using a general-purpose input/output pin of the power management integrated circuit to control the second power source.

20. The method of claim 16, further comprising:
generating an interrupt signal in response to absence of power in the first pin.

* * * * *